(12) United States Patent
Laio et al.

(10) Patent No.: US 7,348,817 B2
(45) Date of Patent: Mar. 25, 2008

(54) CIRCUIT AND METHOD FOR GENERATING CIRCUIT POWER ON RESET SIGNAL

(75) Inventors: Chun-Yao Laio, Hsinchu (TW);
Yu-Ren Chen, Hsinchu (TW)

(73) Assignee: Holtek Semiconductor Inc., Hsinchu (TW)

(*) Notice: Subject to any disclaimer, the term of this patent is extended or adjusted under 35 U.S.C. 154(b) by 91 days.

(21) Appl. No.: 11/366,694

(22) Filed: Mar. 2, 2006

(65) Prior Publication Data

US 2007/0170961 A1     Jul. 26, 2007

(30) Foreign Application Priority Data

Jan. 24, 2006   (TW) ............... 95102710 A

(51) Int. Cl.
  *H03L 7/00* (2006.01)
(52) U.S. Cl. ................. 327/143; 327/198
(58) Field of Classification Search ........ 327/142, 327/143, 198
See application file for complete search history.

(56) References Cited

U.S. PATENT DOCUMENTS

| | | | | |
|---|---|---|---|---|
| 4,717,840 A | * | 1/1988 | Ouyang et al. | 327/143 |
| 4,983,857 A | * | 1/1991 | Steele | 327/143 |
| 5,828,251 A | * | 10/1998 | Freyman et al. | 327/143 |
| 5,898,327 A | * | 4/1999 | Tanaka | 327/143 |
| 5,917,255 A | * | 6/1999 | Ciccone | 307/130 |
| 6,005,423 A | * | 12/1999 | Schultz | 327/143 |
| 6,259,284 B1 | * | 7/2001 | Hwang et al. | 327/142 |
| 6,367,024 B1 | * | 4/2002 | Ezell | 713/340 |
| 6,597,215 B2 | * | 7/2003 | Wang | 327/143 |
| 2002/0145455 A1 | * | 10/2002 | Wang | 327/143 |
| 2004/0169533 A1 | * | 9/2004 | Hirano et al. | 327/143 |
| 2006/0109036 A1 | * | 5/2006 | Hsu | 327/143 |

* cited by examiner

*Primary Examiner*—N. Drew Richards
*Assistant Examiner*—Thomas J Hiltunen
(74) *Attorney, Agent, or Firm*—Volpe and Koenig, PC

(57) ABSTRACT

Disclosed is an improved circuit and method for generating a power on reset signal, the circuit being a two-stage circuit comprising a delay-stage circuit and an output-stage circuit. The delay-stage circuit delays a time for a power on reset signal generated in the output-stage circuit changing from low to high, so that a power voltage having a low rising speed may be normally reset. Further, the two stages provide charging paths and discharging paths so that the power on reset signal may be prevented from changing from high to low when it has changed from low to high, when noises are presented on the power voltage.

18 Claims, 9 Drawing Sheets

CIRCUIT AND METHOD FOR GENERATING CIRCUIT POWER ON RESET SIGNAL

FIELD OF THE INVENTION

The present invention relates to a circuit and method for generating a power on reset signal. More particularly, the present invention relates to a noise-immune and power voltage transition speed and level shift adaptive circuit and method for generating a power on reset signal.

BACKGROUND OF THE INVENTION

Electronic devices are generally power supplied so as to achieve their respective functions and thus the respective power associated circuits therefor are indispensable. For real use, a "reset" function is generally provided for the power operation so that a user may "soft" or "hard" power on and off the electronic device, e.g. the user may reset a computer. The soft power on operation means that the electronic device is reset upon receiving a power on reset signal with the presence of the power. The hard power on operation means that the electronic device is reset upon receiving a power on reset signal, with the power previously forced to be shut off. The electronic device is power on reset not immediately after the power reset signal but after the power on reset signal is transitioned from a disactivated state to an activated state. However, the power on reset signal can not be assured to generate stably when the electronic device is hard powered on. The unstable generation of the power on reset signal may be ascribed to a slow rising speed, noises and level switching of the direct current (DC) power voltage.

Referring to FIGS. 1A and 1B, a conventional power reset signal generation circuit and its signal wave plot are respectively shown therein. As shown, a power voltage Vdd is supplied to the circuit and the power voltage Vdd charges a resistor R and a capacitor C. Then, a voltage on the capacitor C outputs a power on reset signal POR via a buffer B. Since the power voltage Vdd does not take the form of an ideal step wave, a ramp signal is presented before the power voltage Vdd rises to its nominal value. At this time, the power on reset signal POR is not in its activated state and is in a low level state in this case. When the voltage of a node A rises continuously before a specific value is reached (refer to the waveform $V_A$), the power on reset signal is still presented as the low level state, meaning the whole circuit is resetting a corresponding electronic device (not shown). When the voltage of the node A is charged up to the specific value, the power on reset signal POR is changed to an activated level (high level in this case), meaning the electronic device has been finished with the reset operation and is substantively powered on. If the power voltage Vdd rises rapidly (waveform (a)), the voltage A is charged slowly due to the presence of the resistor R. At this time, the output signal POR of the buffer B stays at the low level with a specific time period and then becomes high. Thus, the electronic device is stably reset. However, if the power voltage Vdd rises slowly (waveform (b)) and the voltage of the node A rises almost at the same rate with the power voltage Vdd, the power on reset signal POR does not experience the low level period but stays directly and continuously at the high level. At this time, the electronic device can not be reset normally. If there are positive noises presented on the power voltage Vdd (waveform (c)), the voltage of the node A is instantaneously lower than an input of the buffer B and thus the power on reset signal POR becomes low again. At this time, the electronic device is reset when the user does not intend to reset it. If there are negative noises presented on the power voltage Vdd (also waveform (c)), the capacitor C discharges instantaneously and thus the power on reset signal POR becomes low again when the negative noises disappear from the power voltage Vdd, which does also not meet the requirement of the user.

To solve the above mentioned problem, some electronic components are suggested to be introduced so as to prevent the capacitor C from discharging. One of such power on reset signal generation circuits is shown in FIG. 2A and its signal waveform plot is shown in FIG. 2B. Although failure of the power on reset signal generation due to the noises may be avoided, it is possible to have failure occurred where the power voltage does not substantively experience the reset period.

Therefore, there is a need to provide an improved circuit and method for generating a power on reset signal so that the power on reset signal may be noise-immune and power voltage transition speed and level shift adaptive and thus assured to operate normally.

After a long intensive series of experiments and researches, the inventors finally sets forth such a circuit and method for generating a power on reset signal, which may effectively overcome the demerits existing in the prior art.

SUMMARY OF THE INVENTION

It is, therefore, an object of the present invention to provide an improved circuit and method for generating a power on reset signal through which the power on reset signal may be stably generated with first experiencing a disactivated state and then an activated state in response to a direct current (DC) power input of any rising speed.

It is another object of the present invention to provide an improved circuit and method for generating a power on reset signal through which the power on reset signal may be prevented from transitioning from an activated state back to an original disactivated state in response to a DC power input with positive or negative noises.

It is yet another object of the present invention to provide a circuit and method for generating a power on reset signal through which the power on reset signal may be prevented from transitioning from an activated state back to an original disactivated state in response to a DC power input switched from another level.

In accordance with the present invention, the circuit for generating a power on reset signal comprises a delay-stage circuit comprising a first charging path limiting device, a first capacitor, a first discharging path limiting device and a common discharging path limiting device, wherein the first capacitor has a first end connected to a ground and a second end, the first charging path limiting device receives a direct current (DC) power voltage and charges the first capacitor at the first end thereof with a first charging current to generate a first control voltage signal having a disactivated level, a second control voltage signal and a third control voltage signal smaller than the second control voltage signal, and the first capacitor has a first discharging current flown only through the first and common discharging path limiting devices; and an output-stage circuit comprising a second charging path limiting device, a second capacitor and a second discharging path limiting device, wherein the second capacitor has a first end and a second end connected to the ground, the second control voltage signal charges the second capacitor at the first end thereof via the second charging path limiting device when the first control voltage signal has an activated level, the second charging path limiting device outputs a transitional power on reset signal directly as the power on reset signal, and the second capacitor has a second discharging current flown only through the second and common discharging path limiting devices.

In accordance with the present invention, the method for generating a power on reset signal comprises the steps of providing a first charging path and a first energy storage device, supplying a direct current (DC) power voltage to charge the first energy storage device with a first charging current via the first charging path so as to generate a control voltage signal, providing a second charging path and a second energy storage device, and charging the second energy storage device with a second charging current by the DC power voltage when the first energy storage device is charged to a specific level via the first charging path to output the power on reset signal.

Other objects, advantages and efficacies of the present invention will be described in detail below taken from the preferred embodiments with reference to the accompanying drawings.

BRIEF DESCRIPTION OF THE DRAWINGS

The foregoing summary, as well as the following detailed description of the preferred embodiments, is better understood when read in conjunction with the appended drawings. It is understood, however, that the invention is not limited to the specific methods and disclosed or illustrated. In the drawings.

DETAILED DESCRIPTION OF THE PREFERRED EMBODIMENT

In the present invention, a circuit and method for generating a power on reset signal are disclosed, which will be described below in detail through the preferred embodiments with reference to the accompanying drawings.

Figure 3:
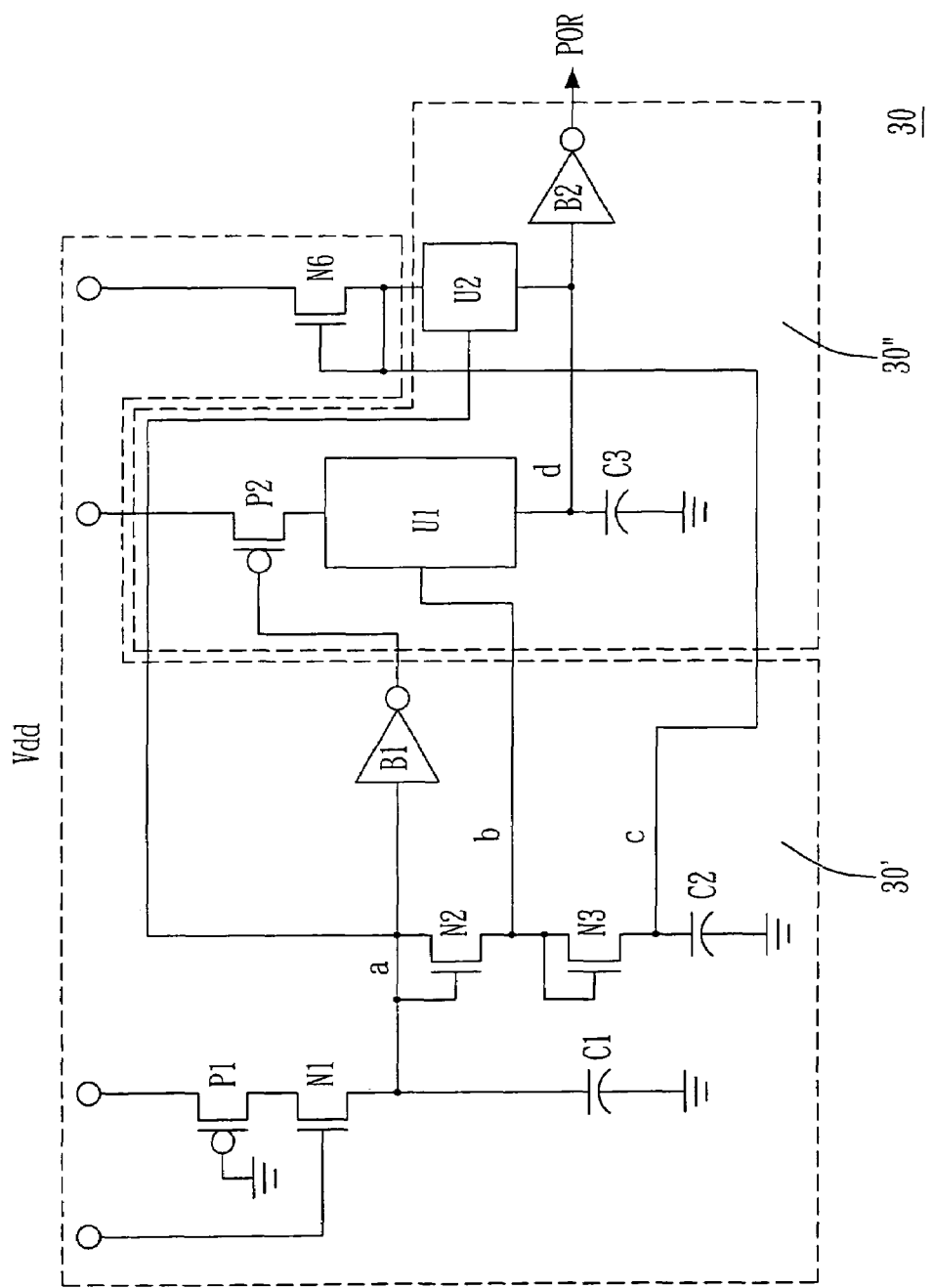
FIG. 3 is a schematic circuit diagram of a circuit for generating a power on reset signal according to an embodiment of the present invention.
Figure 3A:
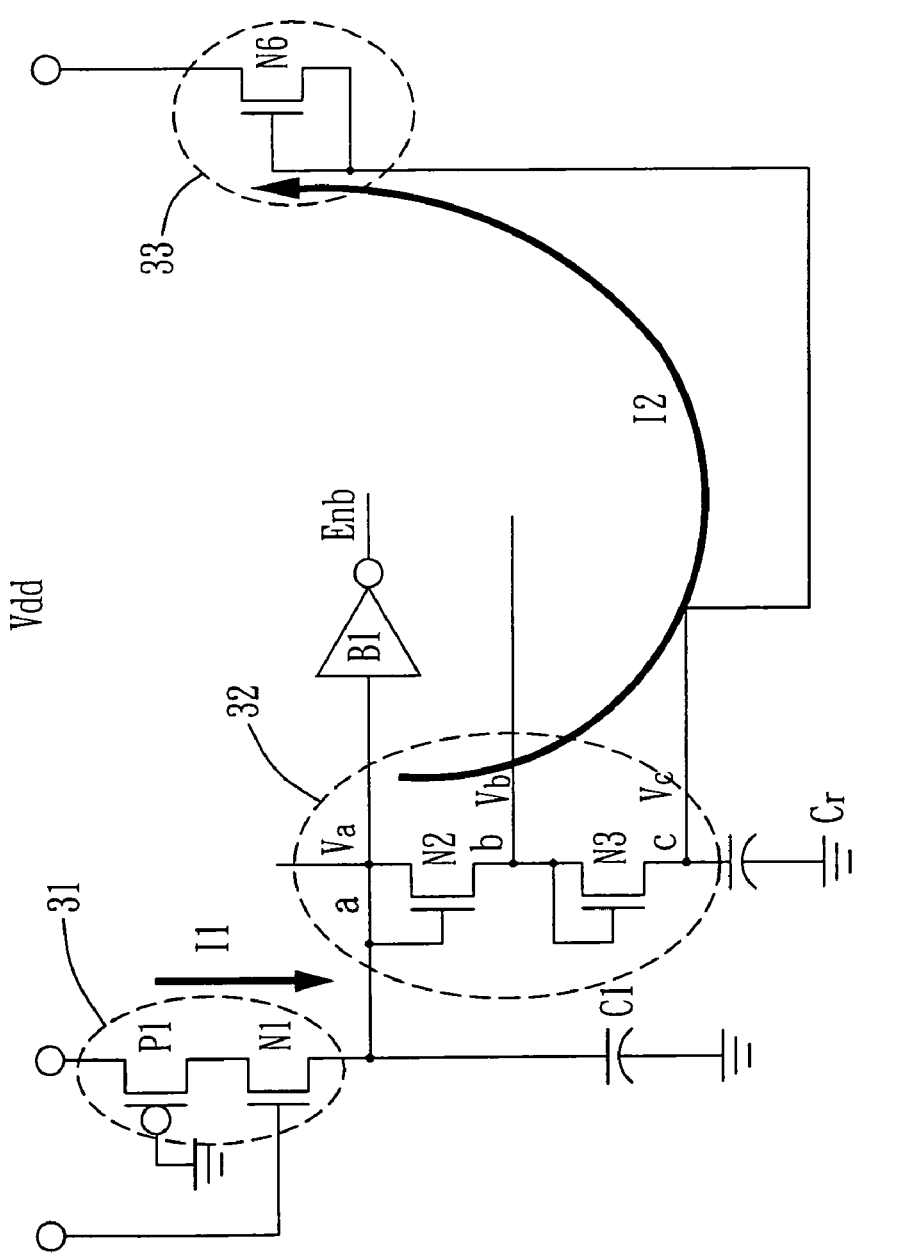
FIG. 3A is a schematic circuit diagram of a delay-stage circuit of the circuit for generating the power on reset signal as shown in FIG. 3.
Figure 3B:
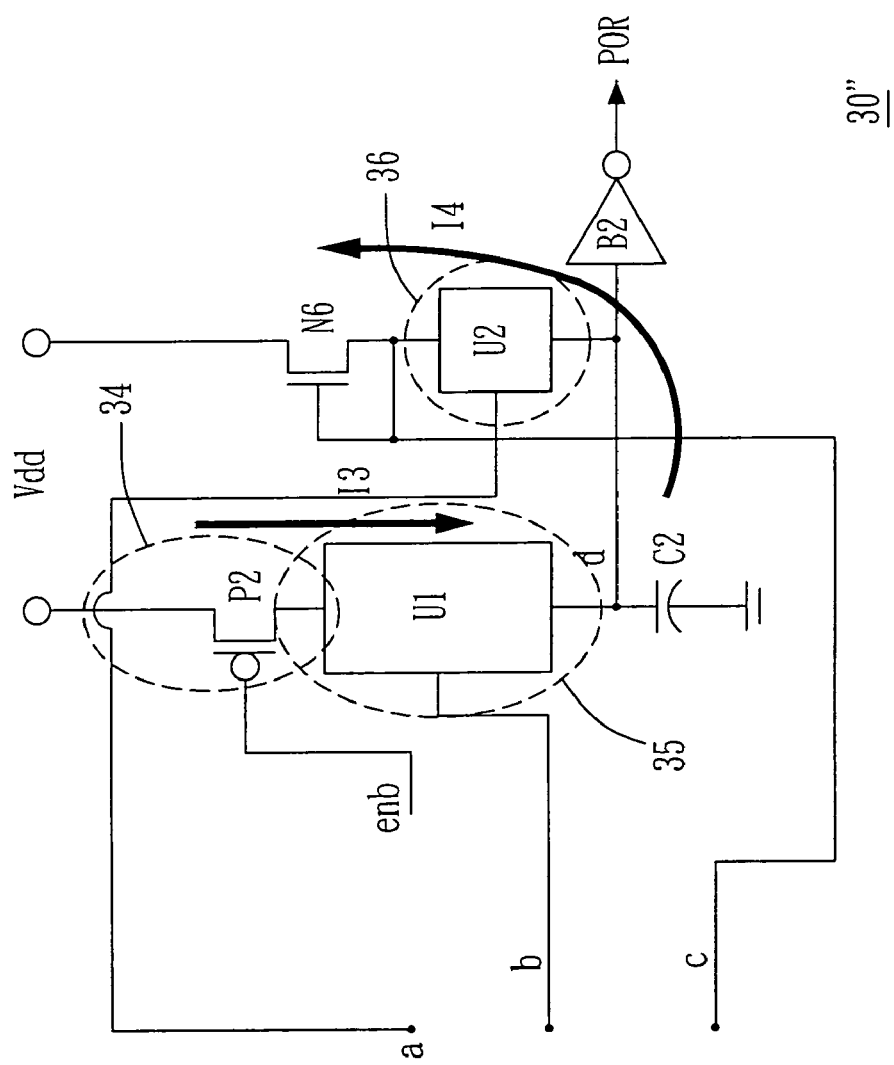
FIG. 3B is a schematic circuit diagram of an output-stage circuit of the circuit for generating the power on reset signal as shown in FIG. 3.

Referring to FIG. 3, a schematic circuit diagram of the circuit for generating a power on reset signal of the present invention is shown therein. As shown, the circuit 30 comprises a delay-stage circuit 30' and an output-stage circuit 30" (shown in FIG. 3A and FIG. 3B respectively). The delay-stage circuit 30" comprises a first charging path limiting device 31, a first capacitor C1, a first discharging path limiting device 32, a first buffer B1 and a second discharging path limiting device 33.

The first charging path limiting device 31 receives a power voltage Vdd and outputs a first charging current I1 in response thereto. It is to be noted that only the charging current I1 flows through the first charging path limiting device 31. In this embodiment, the first charging path limiting deice 31 is an NMOS transistor N1 and a PMOS transistor P1. The PMOS transistor P1 has a drain, a source and a gate, wherein the source receives the power voltage, the gate is connected to ground. The NMOS transistor N1 has a drain, a source and a gate, wherein the drain is connected to the drain of the PMOS transistor P1, the gate receives the power voltage or is connected to the drain and the source is connected to an end of the first capacitor C1. Alternatively, the PMOS transistor P1 may be replaced with a resistor since it is used to provide a resistance for the first charging current I1.

The first capacitor C1 has the other end connected to ground and charged by the power voltage Vdd via the first charging path limiting device 31.

The first discharging path limiting device 32 has an end connected to the first charging path limiting device 31 and the first capacitor C1 at a node A and outputs a first control voltage $V_A$ at the node A and a second control voltage $V_B$ at a node B, respectively, wherein the first control voltage $V_A$ is greater than the second control node $V_B$. When the power voltage Vdd reduces due to noises or being switched to a lower level, the first capacitor C1 discharges a first discharging current I2 only via the first discharging path limiting device 32 since no invert current is allowed as compared to the second discharging current I2 on the first discharging path limiting device 32. Further, due to the provision of the first discharging path limiting device 32, the discharging speed of the first discharging current I2 may be controlled. In this embodiment, the first discharging path limiting device is two NMOS transistors N2 and N3, each of the two MOS transistors N2, and N3 having a drain, a source and a gate, whose connection relationship may be seen in the drawing. In fact, the number of the NMOS transistors of the first discharging path limiting device 32 may be more, depending upon the level of the power voltage Vdd. Further, each of the NMOS transistors of the first discharging path limiting device 32 may be replaced with a PMOS transistor or a diode so that a voltage drop may be provided but the one connected with the first capacitors C1 has to be the NMOS transistor. In addition, the first discharging path limiting device 32 may be connected to a regulating capacitor Cr at a lower end thereof (the end nearer ground) so that a voltage of the regulating capacitor Cr may be provided.

The second path limiting device 33 is connected to the first discharging path limiting device 32 at an end thereof and receives the power voltage Vdd at another end thereof. When the first capacitor C1 discharges, the current I2 is discharged via the first and second discharging path devices 32 and 33.

The first buffer B1 receives the first control voltage VA to output an inverted and amplified control voltage Enb.

The output-stage circuit 30" comprises an output enable device 34, a second charging path limiting device 35, a second capacitor C2, a second buffer B2 and a common discharging path limiting device 36.

The output enable device 34 receives the power voltage Vdd and is controlled by the buffer voltage Enb, which is outputted from the buffer B1 and is an inversed and amplified version of the first control voltage $V_A$. In this embodiment, the output enable device 34 is a PMOS transistor P2. When the buffer voltage Enb changes from high to low, the PMOS transistor P2 is turned on. At this time, the output-stage circuit 30" is initialized to operate.

The second charging path limiting device 35 is connected to the output enable device 35 at an end thereof and controlled by the second control voltage $V_B$. When the output enable device 34 and the second charging path limiting device 35 are initialized, a second charging current I3 charges the second charging path limiting device 35. In this embodiment, the second charging path limiting device 35 is at least a voltage-drop device. The voltage-drop device may be selected from an NMOS transistor, a PMOS transistor and a diode but the one connected to the second capacitor C2 is the NMOS transistor or the diode. One of the at least a voltage-drop device has to receive the second control voltage $V_B$ at a gate thereof so that the charging speed of the second charging current I3 may be controlled. In general, the number of the voltage-drop device has to be greater than two when the power voltage Vdd is greater than two volts. In the case of the NMOS transistor, a gate thereof is connected to a drain thereof.

The second capacitor C2 is connected to the second charging path limiting device 35 at an end thereof and grounded at another end thereof The second capacitor C2 is charged by the power voltage Vdd via the output enable device 34 and the first charging path limiting device 35 and outputs a specific voltage Vd. The specific voltage is inputted to the second buffer B2 and the second buffer B2 outputs a power on reset signal POR.

The common discharging path liming device 36 is connected to the second capacitor C2 at an end thereof and connected to the second discharging path limiting device 33 at the other end thereof. In operation, the common discharging path device 36 is controlled by the first control voltage $V_A$, where the discharging speed of a discharging current flown through the common discharging path limiting device 36 is concurrently controlled. When the second capacitor C2 discharges a second discharging current I4, the discharging current I4 discharges only via the third and second discharging path devices 36 and 35 since no inverse current is allowed on the second charging path limiting device 35. In this embodiment, the common discharging path limiting device 36 is at least a voltage-drop device. The voltage-drop device may be selected from an NMOS transistor, a PMOS transistor and a diode but the one connected to the second capacitor C2 is the NMOS transistor or the diode. One of the at least a voltage-drop device has to receive the first control voltage VA at a gate thereof so that the charging speed of a second discharging current I4 may be controlled. In general, the number of the voltage-drop device has to be greater than two when the power voltage Vdd is greater than two volts. In the case of the NMOS transistor, a gate thereof is connected to a drain thereof.

In the above description, it is implied that the delay-stage circuit 30" provides a delay for occurrence of the high level of the power on reset signal POR of the whole circuit 30. As such, the power on reset signal POR may be guaranteed with experiencing the low level before the high level presents and thus a normal function even for a slowly rising power voltage Vdd. Further, since the first and second discharging path limiting devices 31, 35 and the first and second discharging path limiting devices 32, 36 may avoid an inverse discharging current and an inverse charging current flown thereon, the power on reset signal POR may be assured to be generated normally when the power voltage Vdd has noises thereon. Accordingly, the power on reset signal POR may be generated as the user desires.

Figure 4:
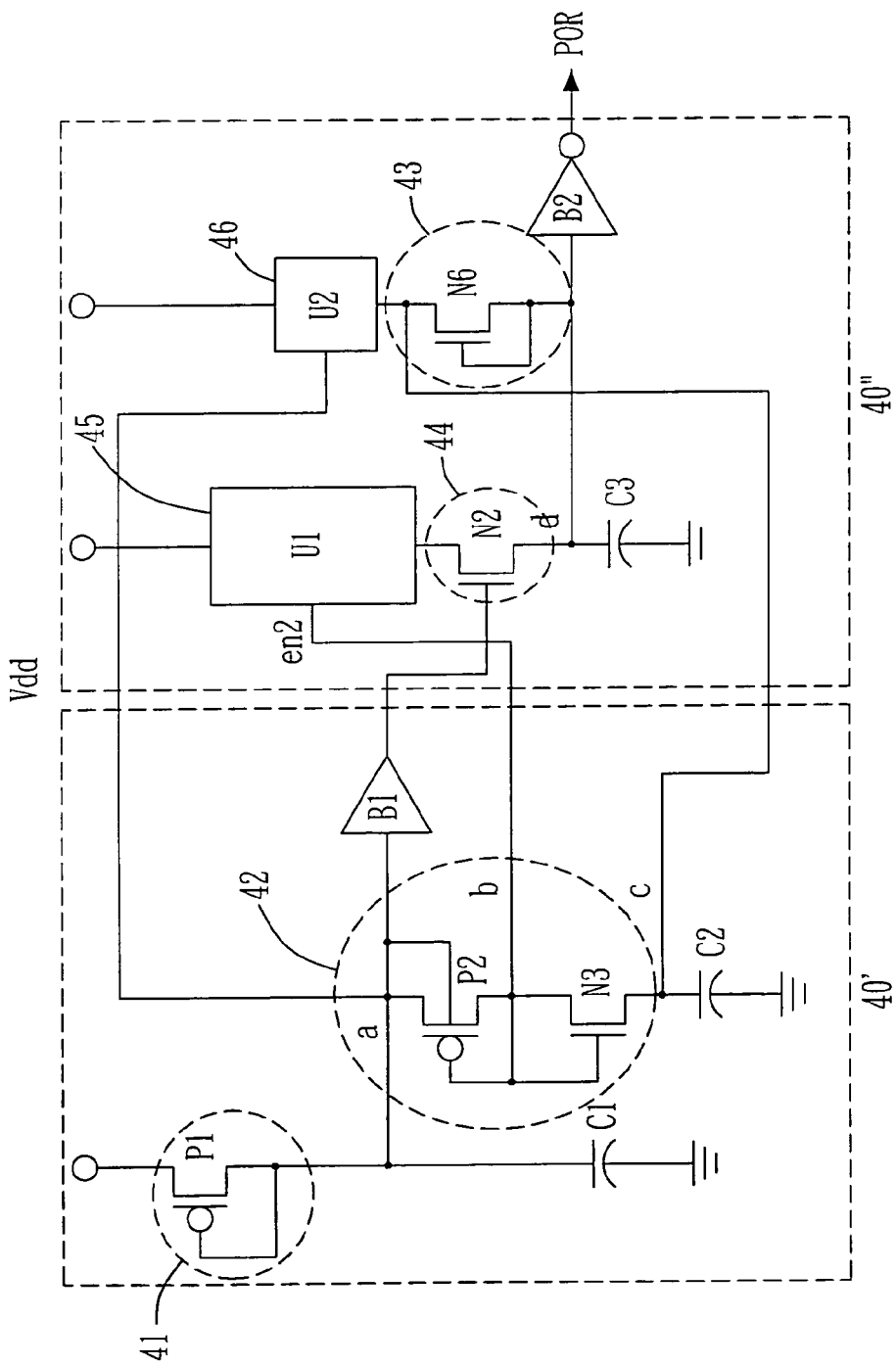
FIG. 4 is a schematic circuit diagram of the circuit for generating the power on reset signal according to another embodiment of the present invention.

Referring to FIG. 4, another embodiment of the circuit for generating a power on reset signal is schematically shown therein. As shown, the circuit 40 is similar to the above embodiment. In this embodiment, a first charging path device 41 comprises only a PMOS transistor and is also used to avoid a discharging current from a first capacitor C1 from flowing thereon. Certainly, the first charging path limiting device 41 may be additionally provided with a resistor so that a charging current flown thereon may be controlled. In addition, a second charging path limiting device 45 directly receives a power voltage Vdd and an output enable device 44, an NMOS transistor N2 in this embodiment, is connected downstream. In addition, a second discharging path limiting device 46 directly receives the power voltage Vdd and a common discharging path limiting device 43 is connected upstream. With the circuit configuration, a normally functioned power on reset signal can also be achieved.

Figure 1A:
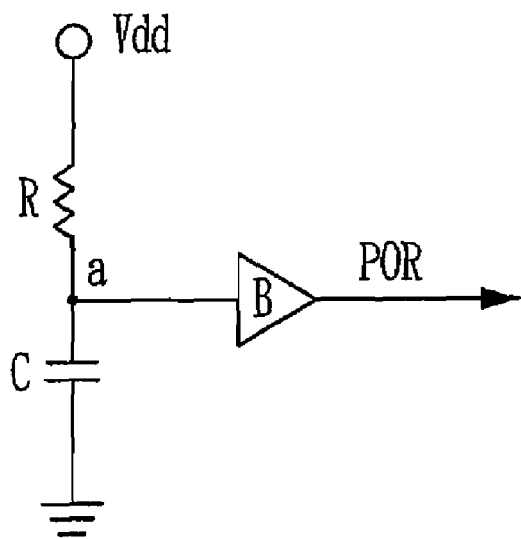
FIG. 1A is a schematic circuit diagram of a conventional circuit for generating a power on reset signal.
Figure 1B:
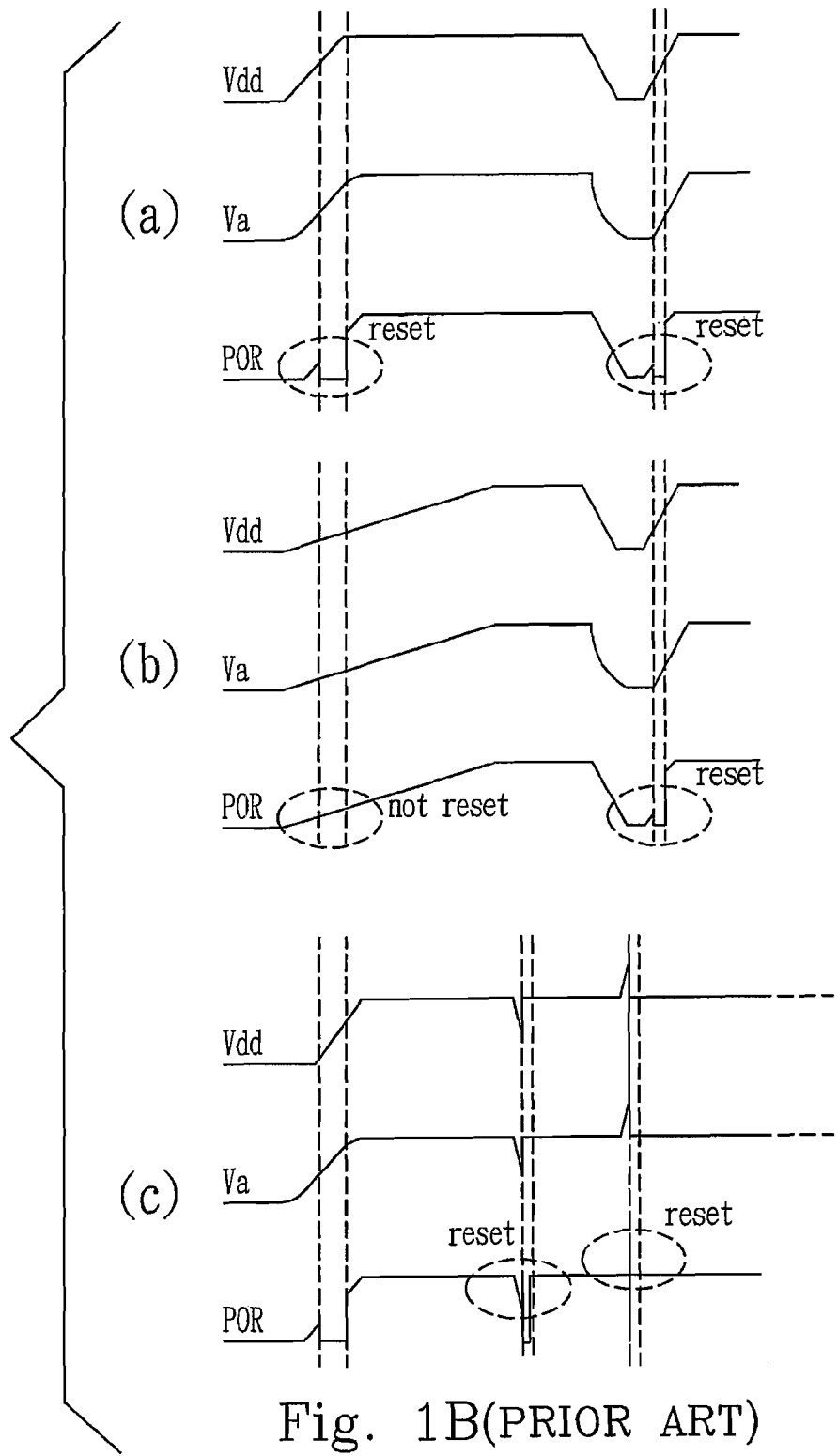
FIG. 1B is a signal waveform plot of the circuit shown in FIG. 1B.
Figure 2A:
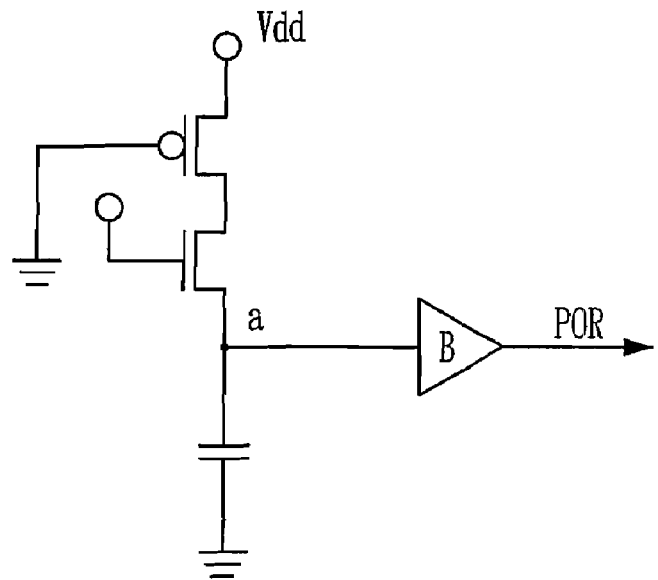
FIG. 2A is a schematic circuit diagram of another conventional circuit for generating a power on reset signal.
Figure 2B:
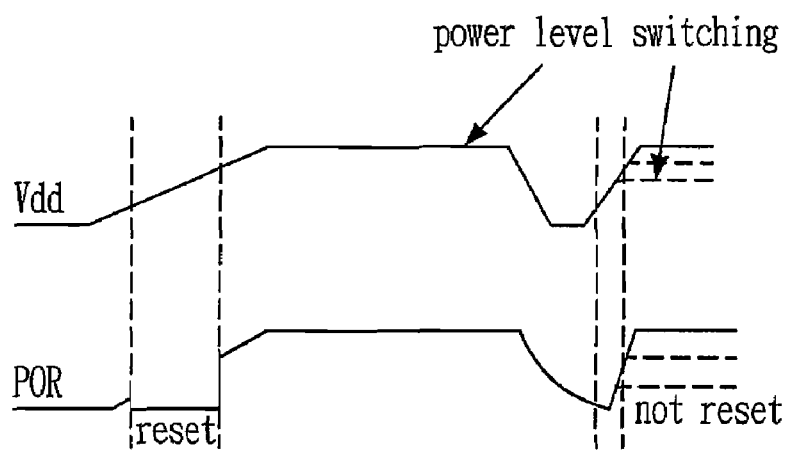
FIG. 2B is a signal waveform plot of the circuit shown in FIG. 2A.
Figure 5:
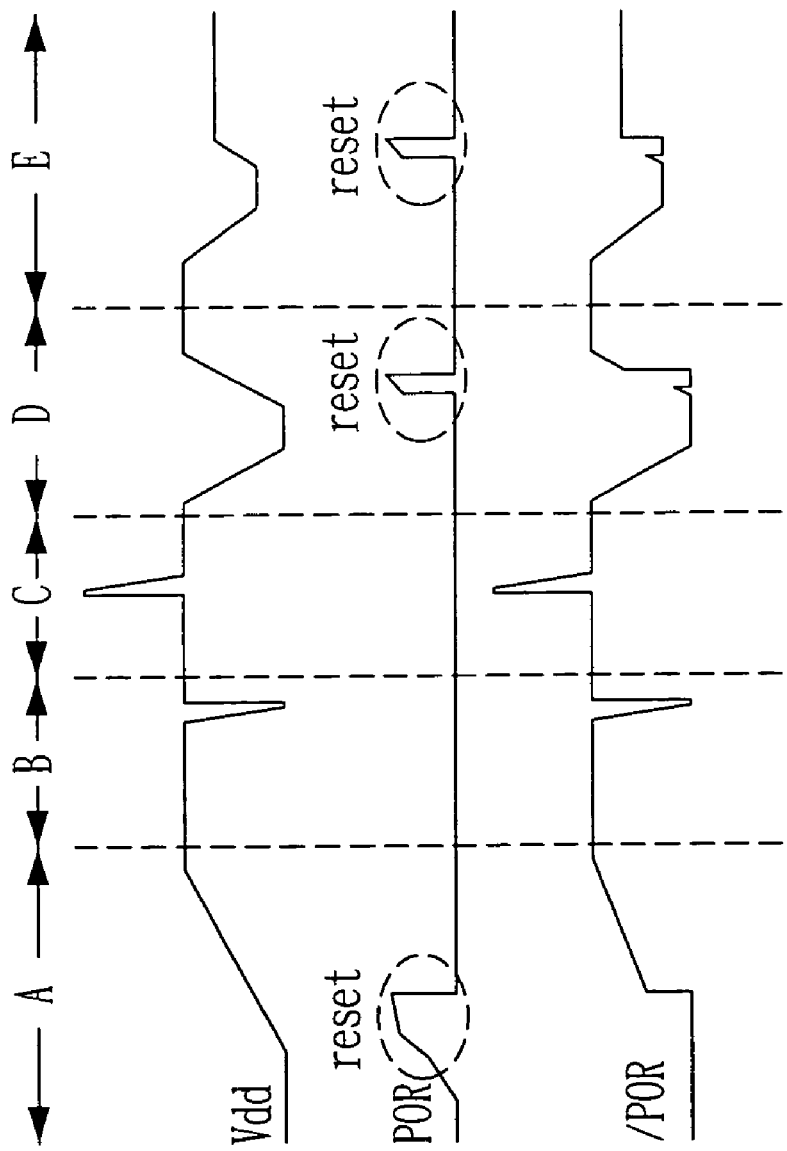
FIG. 5 is a signal waveform plot of the circuit shown in FIG. 3.

Referring to FIG. 5, a signal waveform plot of the circuit shown in FIG. 4 is shown therein. In FIG. 5, an inverse version /POR of the power on reset signal POR is also shown since the signal /POR can show more detailed levels as compared to the signal POR particularly when the power voltage Vdd is switched to a different level. In addition, since the signal POR is inversely provided as opposed to the signal POR shown in FIG. 1B, the inverse version /POR may be provided for comparison with the signal POR shown in FIG. 1B. As shown, in phase A, the signal /POR first experiences a low level stage and then a high level state although the power voltage, Vdd has a slow rising speed. In phase B, the signal /POR does not change back to the previous low level state from the high level state although a negative noise is presented on the power voltage Vdd. In phase C, the signal /POR does not change away from the high level state although a positive noise occurs on the power voltage Vdd. In phase D, the signal /POR changes to the low level state in response to an end of the power voltage Vdd (i.e. a falling wave) as desired. In phase E, the signal /POR indicates the reset operation is normally generated when the power voltage Vdd is switched to a lower level and then to a higher level as compared thereto.

From the above description, it is known that with use of the circuit of the present invention, the power on reset signal can be normally generated or does not automatically change back to the previous low level state from the current high level state even when the power voltage has a slowly rising speed or noises thereon. Accordingly, an electronic device associated with the thus-generated power on reset signal may be normally reset.

Figure 6:
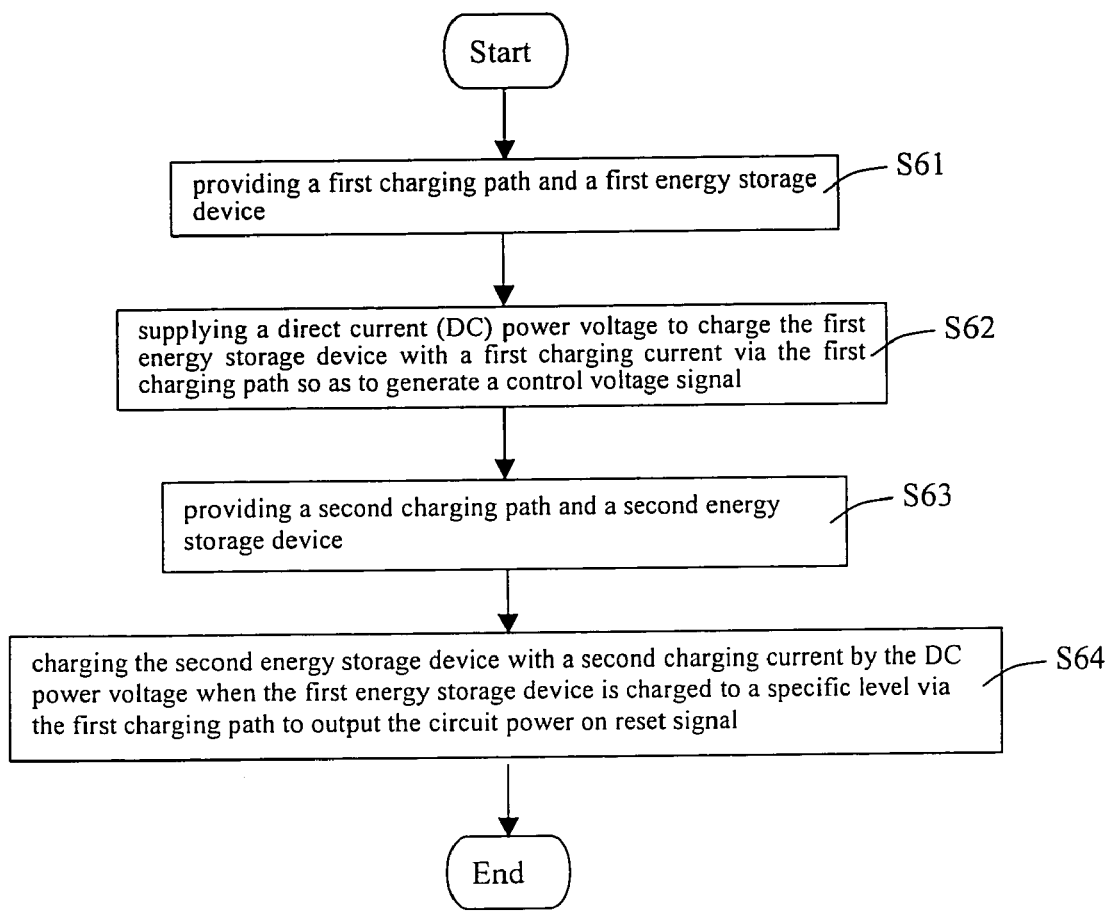
FIG. 6 is a flowchart illustrating a method for generating a power on reset signal according to the present invention.

Referring to FIG. 6, a flowchart illustrating a method for generating a power on reset signal is shown therein. As shown, the method comprises the following steps. First, a first charging path and a first energy storage device are provided (S61). Next, a DC power voltage is provided to charge the first energy storage device with a first charging current via the first charging path so as to generate a control voltage signal (S62). Then, a second charging path and a second energy storage device are provided (S63). Finally, the second energy storage device is charged with a second charging current by the DC power voltage when the first energy storage device is charged to a specific level via the first charging path to output the power on reset signal (S64).

In a preferred embodiment, the following steps are also comprised: providing a first discharging path through which only a first discharging current of the first storage device flows and providing a second discharging path through which only a second discharging current of the second energy storage device flows. In a preferred embodiment, the step of providing the first charging path comprises a step of providing the first charging path through which only the first charging current flows, and the step of providing the second charging path comprises a step of providing the second charging path through which only the second charging current flows. In addition, the step of charging the second energy storage device comprises a step of triggering the second energy storage device to be charged by the DC power voltage by using the control signal with the specific level. In a preferred embodiment, the specific level is a full voltage of the first energy storage device. In a preferred embodiment, each of the first and second energy storage devices is a capacitor.

With use of the method of the present invention, the power on reset signal can be normally generated or does not automatically change back to the previous low level state from the current high level state even when the power voltage has a slowly rising speed or noises thereon. Accordingly, an electronic device associated with the thus-generated power on reset signal may be normally reset.

While the invention has been described in terms of what is presently considered to be the most practical and preferred embodiments, it is to be understood that the invention needs not be limited to the disclosed embodiments. For example, the circuit and method may be made in consideration of only the rising speed of -the power voltage but not in consideration of if any noise is presented, and vice versa. In this case, the corresponding elements may be selectively omitted. In addition, the present invention also contemplates the circuit having more than two stages so that the power on reset signal may be further assured to achieve the same function. In addition, each of the activated levels of the aforementioned signals may be its inverse version. Therefore, it is intended to cover various modifications and similar arrangements included within the spirit and scope of the appended claims, which are to be accorded with the broadest interpretation so as to encompass all such modifications and similar structures.

What is claimed is:

1. A circuit for generating a power on reset signal, comprising:
   a delay-stage circuit comprising a first charging path limiting device, a first capacitor, a first discharging path limiting device and a common discharging path limiting device, wherein the first capacitor has a first end connected to a ground and a second end, the first charging path limiting device receives a direct current (DC) power voltage and charges the first capacitor at the first end thereof with a first charging current to generate a first control voltage signal having a disactivated level, a second control voltage signal and a third control voltage signal smaller than the second control voltage signal, and the first capacitor has a first discharging current flown only through the first and common discharging path limiting devices; and
   an output-stage circuit comprising a second charging path limiting device, a second capacitor and a second discharging path limiting device, wherein the second capacitor has a first end and a second end connected to the ground, the second control voltage signal charges the second capacitor at the first end thereof via the second charging path limiting device when the first control voltage signal has an activated level, the second charging path limiting device outputs a transitional power on reset signal directly as the power on reset signal, and the second capacitor has a second discharging current flown only through the second and common discharging path limiting devices.

2. The circuit as claimed in claim 1, further comprising:
   a first buffer receiving, buffering and amplifying the first control voltage signal to output a buffer voltage so as to control the second charging path limiting device;
   a second buffer receiving, buffering and amplifying the transitional power on reset signal so as to output the power on reset signal; and
   a regulating capacitor having a first end connected to the first charging path limiting device and providing a specific voltage signal, and a second end connected to the ground.

3. The circuit as claimed in claim 2, wherein the first buffer inversely buffers the transitional power on reset signal to output the first control voltage signal and the buffer voltage, and the second buffer inversely buffers the transitional power on reset signal to output the power on reset signal.

4. The circuit as claimed in claim 3, further comprising an output enable device receiving the DC power voltage, connected to the second charging path limiting device and controlled by the buffer voltage, wherein the second charging path limiting device is controlled by the second control voltage signal.

5. The circuit as claimed in claim 4, wherein the output enable device is a first PMOS transistor having a drain connected to the second charging path limiting device, a source receiving the power voltage and a gate controlled by the buffer voltage.

6. The circuit as claimed in claim 5, wherein the first charging path limiting device includes a resistance device limiting a charging speed of the first charging current and a first NMOS transistor having a drain connected to the resistance device, a source connected to the first end of the first capacitor for limiting the first discharging current from flowing therethrough and a gate.

7. The circuit as claimed in claim 5, wherein the first discharging path limiting device comprises at least two voltage-drop devices selected from the group consisting of an NMOS transistor, a PMOS transistor and a diode, wherein the respective gate and drain of the NMOS transistor and the PMOS transistor are connected to each other, one of the at least two voltage-drop devices connected to the first capacitor is the NMOS transistor and the at least two voltage-drop devices have a number determined by the power voltage.

8. The circuit as claimed in claim 5, wherein the second charging path limiting device comprises at least a voltage-drop device selected from the group consisting of an NMOS transistor, a PMOS transistor and a diode, wherein a gate and a drain of the NMOS transistor are connected to each other, the gate of one of the at least a voltage-drop device receives the second control voltage, one of the at least a voltage-drop device connected to the second capacitor is one of the NMOS transistor and the diode, and the at least a voltage-drop device has a number determined by the power voltage.

9. The circuit as claimed in claim 5, wherein the second discharging path limiting device comprises at least a voltage-drop device, the at least a voltage-drop device being selected from the group consisting of an NMOS transistor, a PMOS transistor and a diode, wherein a gate and a drain of the NMOS transistor are connected to each other, wherein the gate of one of the at least a voltage-drop device receives the first control voltage, one of the at least a voltage-drop device connected to the second capacitor is one of the NMOS transistor and the diode, and the at least a voltage-drop device has a number determined by the power voltage.

10. The circuit as claimed in claim 5, wherein the common discharging path limiting device is a second NMOS transistor having a drain receiving the power voltage, a source and a gate connected thereto and receiving the specific voltage.

11. The circuit as claimed in claim 2, wherein the first buffer buffers the transitional power on reset signal to output the first control voltage signal and the buffer voltage and the second buffer inversely buffers the transitional power on reset signal to output the power on reset signal.

12. The circuit as claimed in claim 11, further comprising an output enable device receiving the DC power voltage, connected to the second charging path limiting device and controlled by the buffer voltage, wherein the second charging path limiting device is controlled by the second control voltage signal.

13. The circuit as claimed in claim 12, wherein the output enable device includes a first NMOS transistor having a drain connected to the second charging path limiting device, a source connected to the second capacitor and a gate controlled by the buffer voltage.

14. The circuit as claimed in claim 13, wherein the first charging path limiting device includes a first PMOS transistor having a drain connected to the resistance device, a source connected to the first end of the first capacitor for limiting the first discharging current from flowing therethrough and a gate.

15. The circuit as claimed in claim 13, wherein the first discharging path limiting device comprises at least two voltage-drop devices selected from the group consisting of an NMOS transistor, a PMOS transistor and a diode, wherein a respective gate and drain of the NMOS transistor and the PMOS transistor are connected to each other, one of the at least two voltage-drop devices connected to the first capacitor is the NMOS transistor and the at least two voltage-drop devices have a number determined by the power voltage.

16. The circuit as claimed in claim 13, wherein the second charging path limiting device comprises at least a voltage-drop device selected from the group consisting of an NMOS transistor, a PMOS transistor and a diode, wherein a gate and a drain of the NMOS transistor are connected to each other, a gate of one of the at least a voltage-drop device receives the second control voltage, one of the at least a voltage-drop device connected to the second capacitor is one of the NMOS transistor and the diode, and the at least a voltage-drop device has a number determined by the power voltage.

17. The circuit as claimed in claim 13, wherein the second discharging path limiting device is a third NMOS transistor having a drain receiving the power voltage, a source and a gate connected thereto and receiving the specific voltage.

18. The circuit as claimed in claim 13, wherein the common discharging path limiting device comprises at least a voltage-drop device selected from the group consisting of an NMOS transistor, a PMOS transistor and a diode, wherein a gate and a drain of the NMOS transistor are connected to each other, a gate of one of the at least a voltage-drop device receives the first control voltage, one of the at least a voltage-drop device connected to the second capacitor is one of the NMOS transistor and the diode, and the at least a voltage-drop device has a number determined by the power voltage.

* * * * *